(12) United States Patent
Yoo

(10) Patent No.: US 10,420,261 B2
(45) Date of Patent: Sep. 17, 2019

(54) SCREEN PRINTER IMPROVED IN SOLDER SEPARATION AND METHOD OF CONTROLLING THE SAME

(71) Applicant: Wongeun Yoo, Anseong-si (KR)

(72) Inventor: Wongeun Yoo, Anseong-si (KR)

( * ) Notice: Subject to any disclaimer, the term of this patent is extended or adjusted under 35 U.S.C. 154(b) by 182 days.

(21) Appl. No.: 15/811,702

(22) Filed: Nov. 14, 2017

(65) Prior Publication Data

US 2018/0139875 A1    May 17, 2018

(30) Foreign Application Priority Data

Nov. 14, 2016 (KR) .................. 10-2016-0151406

(51) Int. Cl.
| | | |
|---|---|---|
| *B41F 15/08* | (2006.01) | |
| *B41F 15/20* | (2006.01) | |
| *H05K 3/12* | (2006.01) | |
| *H05K 13/00* | (2006.01) | |
| *B41F 15/34* | (2006.01) | |

(52) U.S. Cl.
CPC ......... *H05K 13/0061* (2013.01); *B41F 15/20* (2013.01); *B41F 15/34* (2013.01); *H05K 3/1216* (2013.01); *H05K 3/1233* (2013.01); *H05K 13/0015* (2013.01); *H05K 2203/0126* (2013.01); *H05K 2203/0139* (2013.01)

(58) Field of Classification Search
CPC .......... B41F 15/20; B41F 15/18; B41F 15/16; B41F 15/26; B41F 15/08; B41F 15/34; B41F 15/0818; H05K 13/0061; H05K 3/1216; H05K 3/1233; H05K 13/0015; H05K 2203/0126; H05K 2203/0139
USPC ........................................................ 101/126
See application file for complete search history.

(56) References Cited

FOREIGN PATENT DOCUMENTS

| JP | 01321685 A | * | 12/1989 |
|---|---|---|---|
| JP | 2006272583 A | * | 10/2006 |
| JP | 2010056182 A | * | 3/2010 |
| JP | 2013-31951 A | | 2/2013 |

* cited by examiner

*Primary Examiner* — Leslie J Evanisko
(74) *Attorney, Agent, or Firm* — Revolution IP, PLLC

(57) ABSTRACT

Disclosed are a screen printer improved in solder separation and a method of controlling the same, in which close contact between a printed circuit board and a mask unit is enhanced to thereby improve the solder separation and stably supply a fixed quantity of solder supplied through a squeeze unit to the printed circuit board.

7 Claims, 6 Drawing Sheets

SCREEN PRINTER IMPROVED IN SOLDER SEPARATION AND METHOD OF CONTROLLING THE SAME

CROSS-REFERENCE TO RELATED APPLICATION

This application claims priority from Korean Patent Application No. 10-2016-0151406, filed on Nov. 14, 2016 in the Korean Intellectual Property Office, the disclosure of which is incorporated herein by reference.

BACKGROUND OF THE INVENTION (a) Field of the Invention

The present disclosure relates to a screen printer improved in solder separation and a method of controlling the same, and more particularly to a screen printer improved in solder separation and a method of controlling the same, in which close contact between a printed circuit board and a mask unit is enhanced to thereby improve the solder separation and stably supply a fixed quantity of solder supplied through a squeeze unit to the printed circuit board.

(b) Description of the Related Art

With development of a semiconductor industry, a substrate has been generally produced depending on a surface mount technology (SMT) process. Here, as automated equipment used in performing soldering preprocessing work of a substrate for the SMT process, a screen printer refers to a device for applying lead of a cream solder type to a stripped solder surface of a circuit pattern so that an integrated circuit element, a resistor, a condenser and the like parts can be soldered.

In general, the screen printer includes an input-side lateral conveyor configured to feed and convey a printed circuit board to a processing position, a squeezer configured to squeeze the lead of the cream solder type on a mask, and an aligning unit provided inside the screen printer and configured to align the printed circuit board.

However, a conventional screen printer has a problem that a fixed quantity of lead is not supplied to the printed circuit board since the printed circuit board and the mask are separated by a gap between the printed circuit board and the mask when the lead is squeezed and supplied to the printed circuit board.

Further, there is a need of techniques for stably supplying a fixed quantity of lead to the printed circuit board because a chip for the printed circuit board has decreased in a surface area (e.g. length:breadth=0.4 mm:0.2 mm), and a pitch between terminals in the chip of the printed circuit board has been also reduced (e.g. about 0.3 mm).

SUMMARY OF THE INVENTION

Accordingly, the present disclosure is conceived to solve the conventional problems, and an aspect of the present disclosure is to provide a screen printer improved in solder separation and a method of controlling the same, in which close contact between a printed circuit board and a mask unit is enhanced to thereby improve the solder separation and stably supply a fixed quantity of solder supplied through a squeeze unit to the printed circuit board.

According to an aspect of the present disclosure, there is provided an screen printer improved in solder separation, including: a substrate jig which supports a printed circuit board, and includes a through hole formed in between a plurality of printed circuit boards supported being spaced apart from each other; a jig block on which the substrate jig is put on; a mask unit which includes pattern holes formed to supply solder corresponding to preset positions of the printed circuit board; a jig conveying unit which conveys the substrate jig toward a top of the jig block; an ascending/descending driving unit which moves the jig block up and down or moves both the jig block and the jig conveying unit up and down; and a suction unit which includes a sucker protruding from the jig block to be inserted in the through hole and making the mask unit be in close contact with the printed circuit board or the substrate jig by a suction force when the printed circuit board is in contact with the mask unit by the ascending/descending driving unit, and a suction driver driving the sucker to have the suction force so that the mask unit can be in close contact with the printed circuit board or the substrate jig.

Here, the top surface of the jig conveying unit may be formed to have substantially the same level as the top surface of the printed circuit board or the top surface of the substrate jig when the printed circuit board is in contact with the mask unit by the ascending/descending driving unit.

The screen printer improved in the solder separation may further include an aligning unit which moves the jig conveying unit relative to the substrate jig so that the substrate jig can be in position in the jig block.

Here, the jig conveying unit may include a suction holder configured to face the mask unit; and a holding driver configured to drive the suction holder to have a suction force when the mask unit is seated on the jig conveying unit by ascent/descent of the ascending/descending driving unit.

According to an aspect of the present disclosure, there is provided a method of controlling the foregoing screen printer, the method including: a jig conveying operation to move the substrate jig toward a top of the jig block; a first ascending/descending operation to move the jig block up and down so that the substrate jig can be put on the jig block; a second ascending/descending operation to move the substrate jig put on the jig block to a bottom of the mask unit; and a sucking operation to make the mask unit be in close contact with the printed circuit board or the substrate jig by a suction force of the sucker inserted in the through hole when the printed circuit board is in contact with the mask unit via the second ascending/descending operation.

The method of controlling the screen printer according to the present disclosure may further include an aligning operation to move the jig conveying unit relative to the substrate jig so that the substrate jig can be in position in the jig block.

The method of controlling the screen printer according to the present disclosure may further include a mask holding operation to make the mask unit be in close contact with the jig conveying unit by a suction force when the mask unit is in contact with the jig conveying unit via the second ascending/descending operation.

BRIEF DESCRIPTION OF THE DRAWINGS

The above and/or other aspects of the present disclosure will become apparent and more readily appreciated from the following description of the exemplary embodiments, taken in conjunction with the accompanying drawings, in which.

DETAILED DESCRIPTION OF THE EMBODIMENTS

Hereinafter, embodiments of a screen printer improved in solder separation and a method of controlling the same will be described with reference to the accompanying drawings. The present disclosure is not limited or restricted by the following embodiments. Further, detailed descriptions of publicly known functions or structures may be omitted to make the gist of the present disclosure clear.

Figure 1:
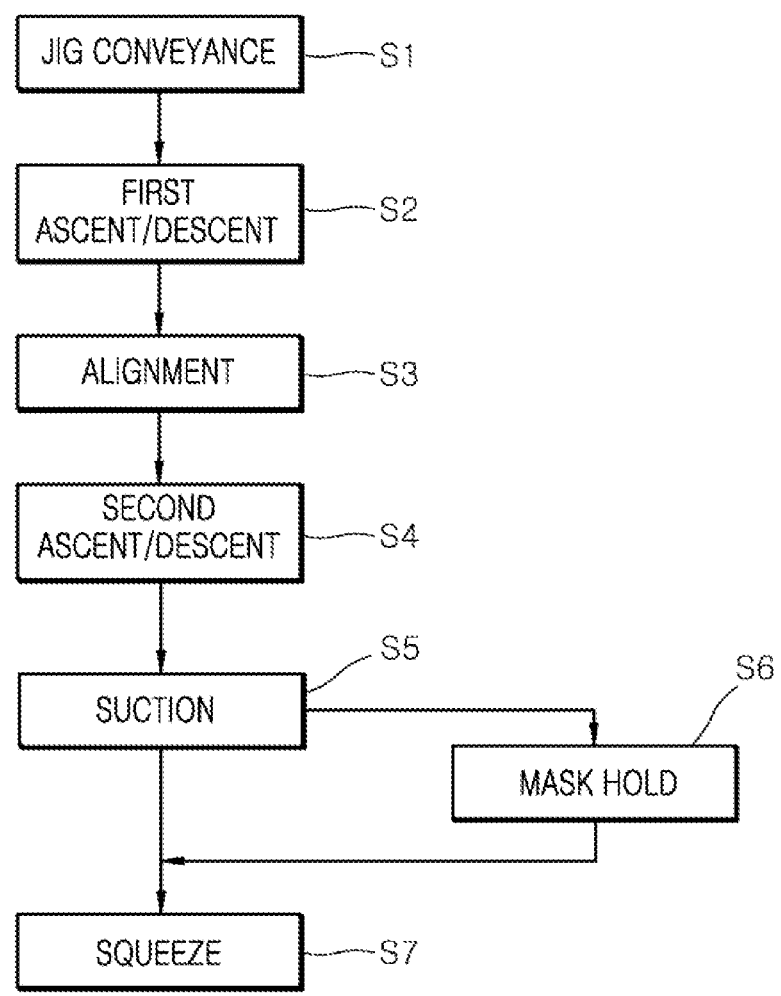
FIG. 1 is a view of illustrating a method of controlling a screen printer according to one embodiment of the present disclosure.
Figure 2:
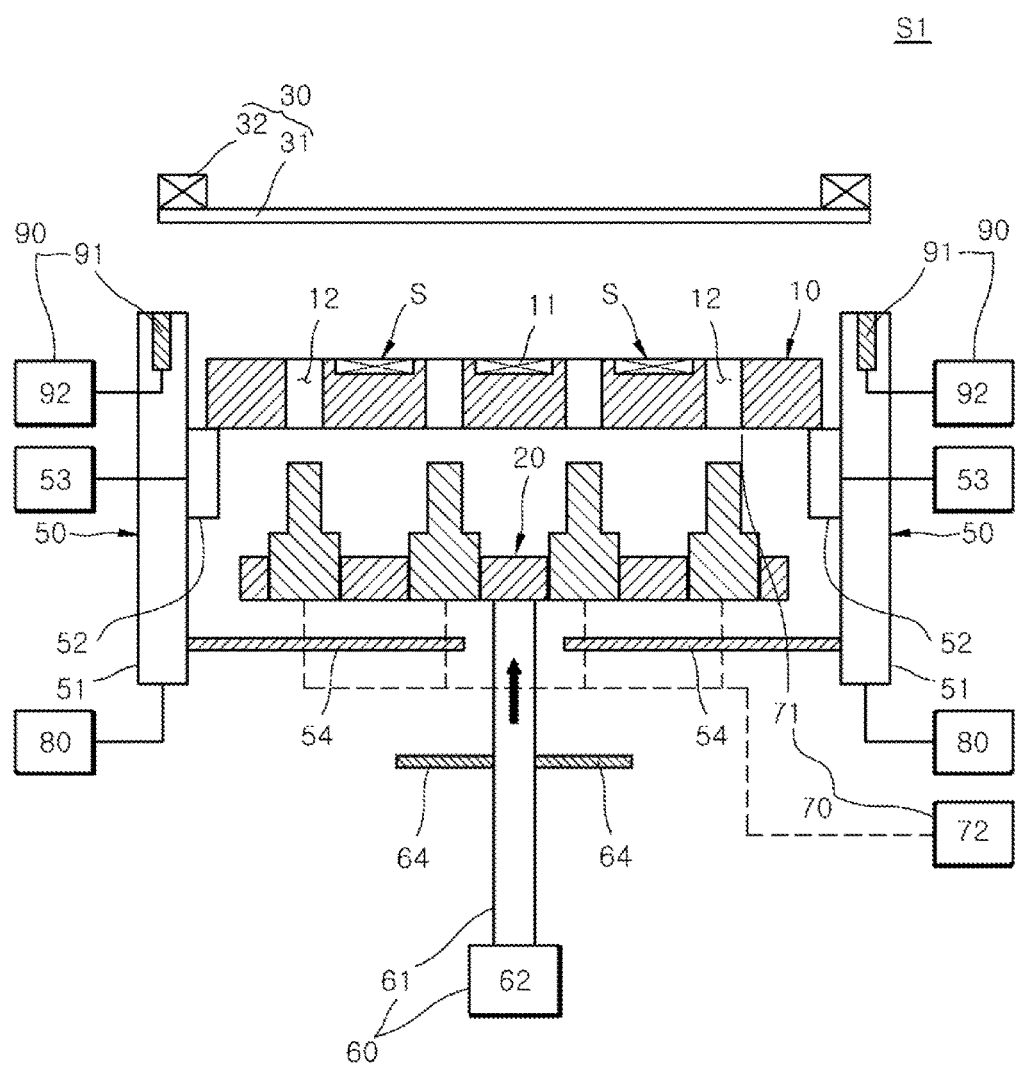
FIG. 2 is a view of illustrating an operation state of the screen printer based on a jig conveying operation in the method of controlling the screen printer according to one embodiment of the present disclosure.
Figure 3:
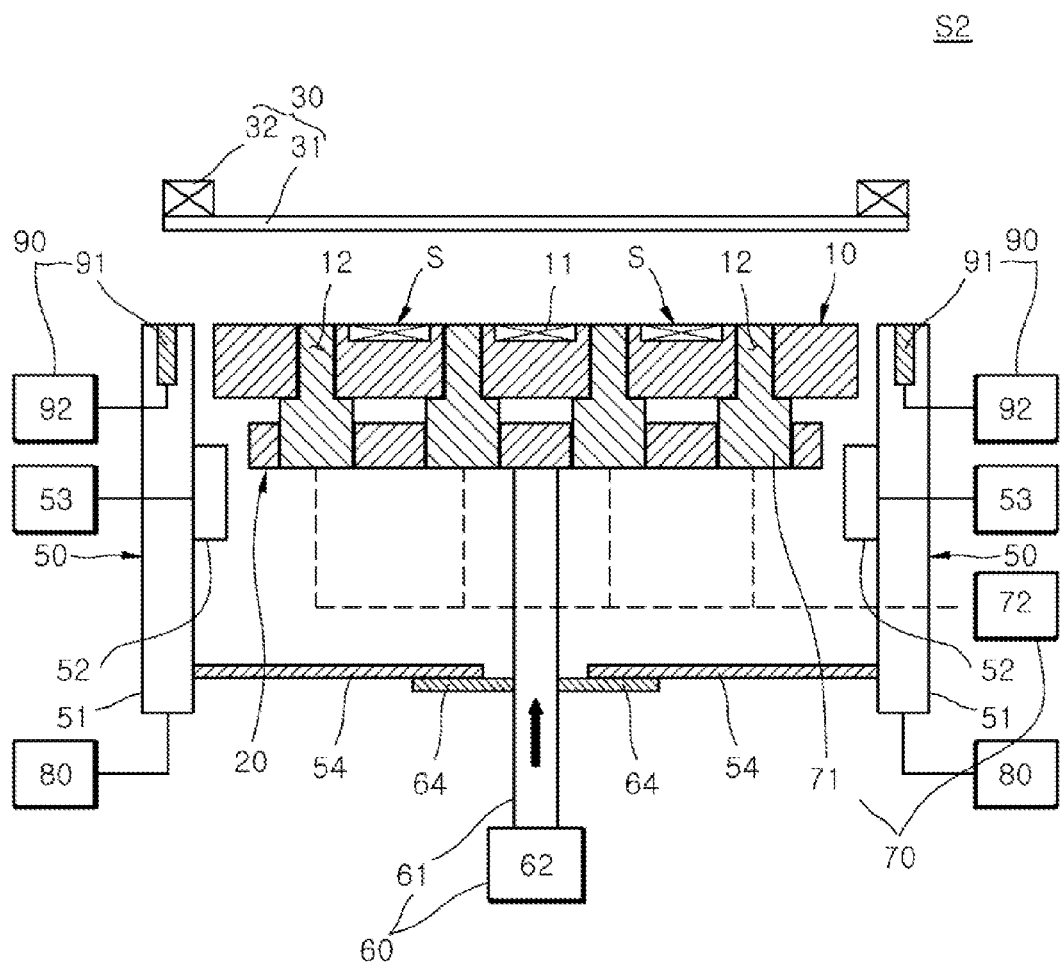
FIG. 3 is a view of illustrating an operation state of the screen printer based on a first ascending/descending operation in the method of controlling the screen printer according to one embodiment of the present disclosure.
Figure 4:
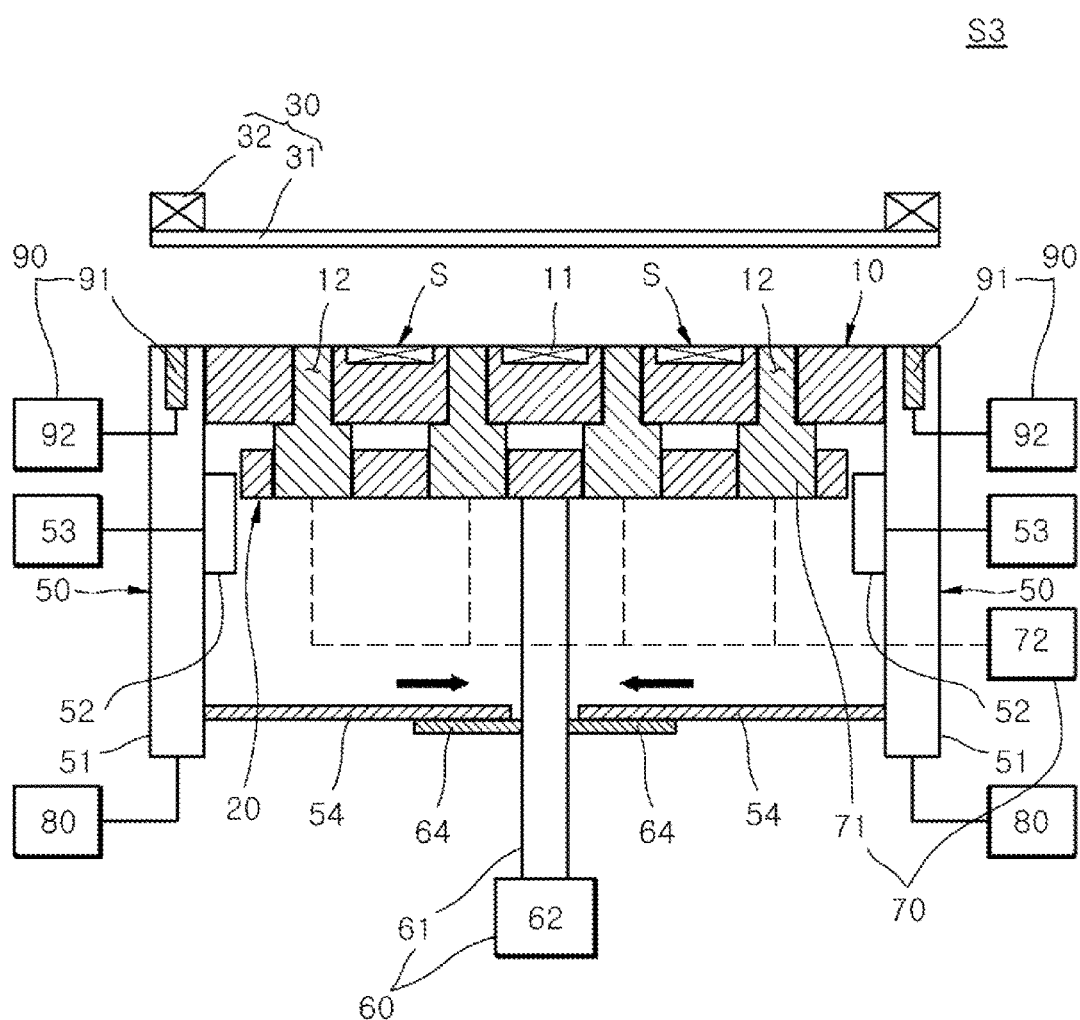
FIG. 4 is a view of illustrating an operation state of the screen printer based on an aligning operation in the method of controlling the screen printer according to one embodiment of the present disclosure.
Figure 5:
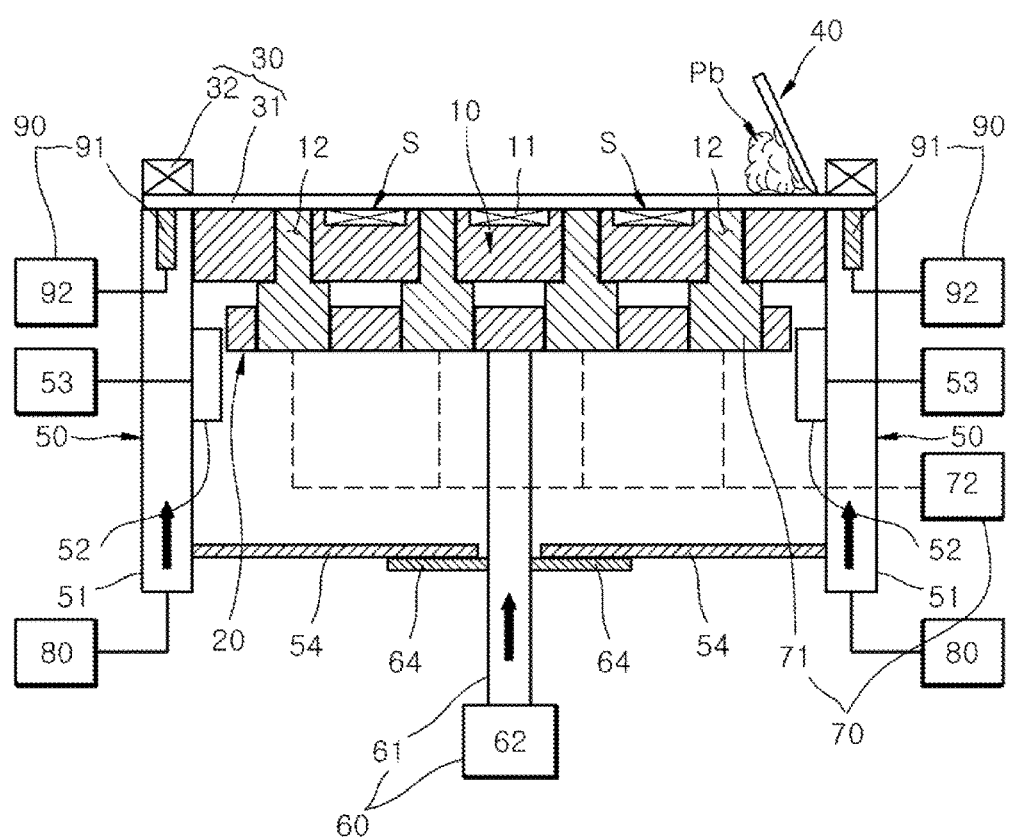
FIG. 5 is a view of illustrating an operation sate of the screen printer based on a second ascending/descending operation in the method of controlling the screen printer according to one embodiment of the present disclosure.
Figure 6:
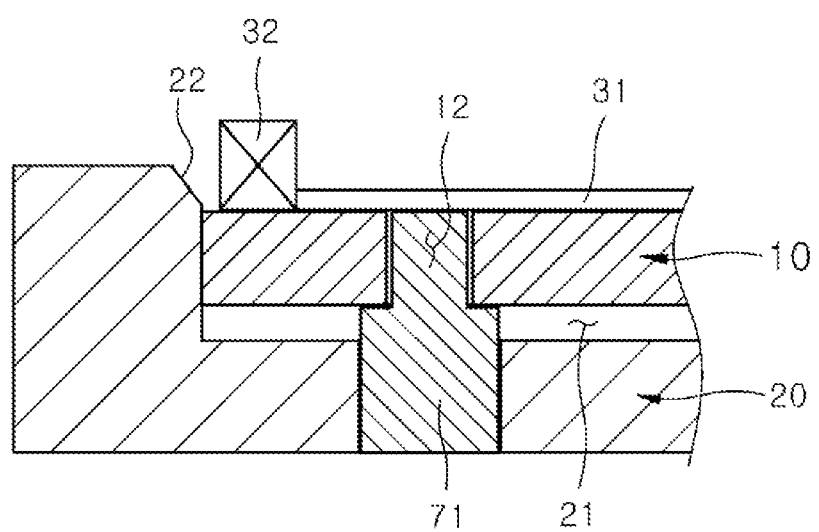
FIG. 6 is another view of illustrating an operation sate of the screen printer based on the second ascending/descending operation in the method of controlling the screen printer according to one embodiment of the present disclosure.

FIG. 1 is a view of illustrating a method of controlling a screen printer according to one embodiment of the present disclosure, FIG. 2 is a view of illustrating an operation sate of the screen printer based on a jig conveying operation in the method of controlling the screen printer according to one embodiment of the present disclosure, FIG. 3 is a view of illustrating an operation sate of the screen printer based on a first ascending/descending operation in the method of controlling the screen printer according to one embodiment of the present disclosure, FIG. 4 is a view of illustrating an operation sate of the screen printer based on an aligning operation in the method of controlling the screen printer according to one embodiment of the present disclosure, FIG. 5 is a view of illustrating an operation sate of the screen printer based on a second ascending/descending operation in the method of controlling the screen printer according to one embodiment of the present disclosure, and FIG. 6 is another view of illustrating an operation sate of the screen printer based on the second ascending/descending operation in the method of controlling the screen printer according to one embodiment of the present disclosure.

Referring to FIG. 1 to FIG. 6, the screen printer according to one embodiment of the present disclosure, which is improved in solder separation, may include a substrate jig 10, a jig block 20, a mask unit 30, a jig conveying unit 50, an ascending/descending driving unit 60, and a suction unit 70, may further include an aligning unit 80, and may furthermore include a squeeze unit 40.

The substrate jig 10 is configured to support a printed circuit board S.

Here, the substrate jig 10 may be recessed and formed with a support groove 11 in which the printed circuit board S is inserted and seated.

Further, the substrate jig 10 may be formed with a through hole 12 in which a sucker 71 (to be described later) is inserted. The through hole 12 may be formed in the substrate jig 10 so as to be placed in between a plurality of printed circuit boards S which will be spaced apart from each other and supported in the substrate jig 10. The through hole 12 formed in the substrate jig 10 may be placed at an outer lateral side of the outermost printed circuit board S.

Further, various printed circuit boards are possible without limiting the kind of printed circuit board S. For example, the printed circuit board S may include a chip having a small surface area (e.g. length:breadth=0.4 mm:0.2 mm), and a pitch between terminals in the chip of the printed circuit board S may be formed as small as about 0.3 mm.

For example, when the printed circuit board S is seated on the substrate jig 10, the top surface of the substrate jig 10 has substantially the same level as the top surface of the printed circuit board S. Alternatively, when the printed circuit board S is seated on the substrate jig 10, the top surface of the substrate jig 10 may be lower than the top surface of the printed circuit board S.

The jig block 20 is configured to put the substrate jigs 10 thereon.

Here, the jig block 20 may be recessed and formed a seat 21 in which the substrate jig 10 is inserted and seated. Further, the jig block 20 may be formed with a guide slope 22 to chamfer an edge of a stepped portion formed by the seat 21. The guide slope 22 can guide the substrate jig 10 toward the seat 21 even though there is a minute error between the substrate jig 10 and the jig block 20.

The mask unit 30 is formed with a pattern hole (not shown) through which solder Pb is supplied corresponding to preset positions on the printed circuit board S. The preset positions on the printed circuit board S may show positions of the chips in the printed circuit board S.

The mask unit 30 is shaped like a plate, and includes a mask 31 in which the pattern hole (not shown) is formed, and a mask frame 32 which supports the edges of the mask 31. The mask frame 32 may be configured to keep the mask 31 flat.

The jig conveying unit 50 conveys the substrate jig 10 toward the top of the jig block 20.

The jig conveying unit 50 may include guide blocks 51 respectively provided at opposite sides of the jig block 20 with respect to a conveying direction of the substrate jig 10, a conveyer 52 provided in the guide block 51 and supporting the substrate jig 10 to be movable, and a conveying driver 53 driving the conveyer 52 so that the substrate jig 10 can move toward the top of the jig block 20. Here, the conveyer 52 may be materialized by a roller or a belt conveyor on which a bottom edge of the substrate jig 10 is supported, and the conveying driver 53 can drive the conveyer 52 to rotate.

The ascending/descending driving unit 60 can move the jig block 20 up and down, or move both the jig block 20 and the jig conveying unit 50 up and down. The ascending/descending driving unit 60 may include an ascending/descending rod 61 protruding from the bottom of the jig block 20, and an ascending/descending driver 62 driving the ascending/descending rod 61 to move up and down.

When the ascending/descending driving unit 60 moves the jig block 20 up to make the printed circuit board S be in contact with the mask unit 30, the top surface of the jig conveying unit 50 may have substantially the same level as the top surface of the printed circuit board S or the top surface of the substrate jig 10.

If the ascending/descending driving unit 60 moves both the jig block 20 and the jig conveying unit 50 up, the substrate jig 10 put on the jig block 20 may move toward the bottom of the mask 31 of the mask unit 30.

The suction unit 70 sucks the mask unit 30 to be close contact with the printed circuit board S or the substrate jig 10 when the printed circuit board S is in contact with the mask unit 30 by the ascending/descending driving unit 60.

The suction unit 70 may include a sucker 71 protruding from the jig block 20 and inserted in the through hole 12, and a suction driver 72 driving the sucker 71 to have a suction force so that the mask 31 of the mask unit 30 can be in close contact with the printed circuit board S or the substrate jig 10. Thus, the suction unit 70 can enhance the close contact between the printed circuit board S and the mask 31, and improve the solder separation.

In addition, the suction unit 70 may further include an elastic pad provided at an end of the sucker 71. With this, if the ascending/descending driving unit 60 moves the suction unit 70 up and therefore the sucker 71 is inserted in the through hole 12, the top surface of the elastic pad may be higher than the top surface of the substrate jig 10 or may have substantially the same level with the top surface of the substrate jig 10. If the top surface of the elastic pad protrudes from the top surface of the substrate jig 10, the elastic pad is elastically transformed when the suction unit 70 makes the mask unit 30 be in close contact with the printed circuit board S or the substrate jig 10, thereby enhancing the close contact between the mask 31 and the printed circuit board S or between the mask 31 and the substrate jig 10 and improving the solder separation.

The aligning unit 80 moves the guide block 51 of the jig conveying unit 50 relative to the substrate jig 10 so that the substrate jig 10 can be in position in the jig block 20. The aligning unit 80 may make the guide block 51 be supported at each end of the substrate jig 10 with respect to the conveying direction of the substrate jig 10.

In accordance with the foregoing operations of the jig conveying unit 50, the ascending/descending driving unit 60, the aligning unit 80, and the suction unit 70, the top surface of the jig conveying unit 50 may be formed to have substantially the same level as the top surface of the printed circuit board S or the top surface of the substrate jig 10, thereby enhancing the close contact between the mask 31 and the printed circuit board S and improving the solder separation.

The squeeze unit 40 squeezes the solder Pb put on the mask unit 30 so that the solder Pb can be supplied to the preset positions of the printed circuit board S. The squeeze unit 40 may have various publicly known forms to squeeze the solder Pb put on the mask unit 30.

Here, the jig conveying unit 50 may include a mask holding unit 90.

The mask holding unit 90 makes the mask unit 30 be in close contact with the jig conveying unit 50 by a suction force when the mask unit 30 is in contact with the jig conveying unit 50 by the ascending/descending driving unit 60. The mask holding unit 90 holds the mask unit 30 on the guide block 51 of the jig conveying unit 50. The mask holding unit 90 includes a suction holder 91 provided to face the mask unit 30, and a holding driver 92 driving the suction holder 91 to have a suction force when the mask frame 32 of the mask unit 30 is in contact with the guide block 51 of the jig conveying unit 50 by ascent/descent of the ascending/descending driving unit 60. The mask holding unit 90 may further include a holding elastic member (not shown) provided at an end of the suction holder 91. The holding elastic member (not shown) may be identical to the same as the elastic pad.

By sucking the mask frame 32 of the mask unit 30 with the suction force caused by the operation of the holding driver 92, it is possible to make the mask frame 32 of the mask unit 30 be in contact with the top surface of the guide block 51.

Further, the jig conveying unit 50 may be formed with a first ascending/descending interlocker 54 protruding toward the ascending/descending rod 61 of the ascending/descending driving unit 60. The first ascending/descending interlocker 54 does not interfere with the ascending/descending rod 61 when the ascending/descending rod 61 is moved up and down by the ascending/descending driving unit 60 or when the guide block 51 is horizontally moved by the aligning unit 80.

Similarly, the ascending/descending rod 61 of the ascending/descending driving unit 60 may be formed with a second ascending/descending interlocker 64 protruding toward the guide block 51 of the jig conveying unit 50. When the sucker 71 is inserted in the through hole 12, the second ascending/descending interlocker 64 is supported on the bottom of the first ascending/descending interlocker 54.

In this case, as the second ascending/descending interlocker 64 is supported on the bottom of the first ascending/descending interlocker 54, at least one of the top surface of the sucker 71 and the top surface of the jig conveying unit 50 may be formed to have substantially the same level as or be lower than the top surface of the printed circuit board S or the top surface of the substrate jig 10 without any additional operation.

Below, a method of controlling the screen printer according to one embodiment of the present disclosure will be described.

The method of controlling the screen printer according to one embodiment of the present disclosure is to control the screen printer according to one embodiment of the present disclosure, and may include a jig conveying operation S1, a first ascending/descending operation S2, a second ascending/descending operation S4, and a sucking operation S5, may further include an aligning operation S3, may further include a mask holding operation S6, and may further include a squeezing operation S7.

In the jig conveying operation S1, the substrate jig 10 is moved toward the top of the jig block 20. The jig conveying operation S1 may be implemented by the operation of the jig conveying unit 50.

In the first ascending/descending operation S2, the jig block 20 is moved up so that the substrate jig 10 can be put on the jig block 20. In this case, at least one of the top surface of the sucker 71 and the top surface of the jig conveying unit 50 may be formed to have substantially the same level or be lower than the top surface of the printed circuit board S or the top surface of the substrate jig 10. The first ascending/descending operation S2 may be implemented by the operation of the ascending/descending driving unit 60.

In the second ascending/descending operation S4, the substrate jig 10 put on the jig block 20 is moved to the bottom of the mask 31 of the mask unit 30. The second ascending/descending operation S4 may be implemented by the operation of the ascending/descending driving unit 60.

In the sucking operation S5, when the printed circuit board S is in contact with the mask unit 30 via the second ascending/descending operation S4, the mask 31 of the mask unit 30 is in close contact with the printed circuit board S or the substrate jig 10 by the suction force. The sucking operation S5 may be implemented by the operation of the suction unit 70.

In the aligning operation S3, the jig conveying unit 50 is moved relative to the substrate jig 10 so that the substrate jig 10 can be in position in the jig block 20. The aligning operation S3 may be implemented by the operation of the aligning unit 80.

In the mask holding operation S6, if the mask frame 32 of the mask unit 30 is in contact with the guide block 51 of the jig conveying unit 50 via the second ascending/descending operation S4, the mask frame 32 of the mask unit 30 is close contact with the guide block 51 of the jig conveying unit 50 by the suction force. In the mask holding operation S6, the suction force may be given to the suction holder 91 provided in the jig conveying unit 50 so that the mask frame 32 of the mask unit 30 can be supported and held by the guide block 51 of the jig conveying unit 50. The mask holding operation S6 may be implemented by the operation of the mask holding unit 90.

In the squeezing operation S7, the solder Pb put on the mask unit 30 is squeezed so that the solder Pb can be supplied to the preset positions on the printed circuit board S. The squeezing operation S7 may be implemented by the operation of the squeeze unit 40.

According to the foregoing screen printer improved in solder separation and the foregoing method of controlling the same, the close contact between the printed circuit board S and the mask unit 30 is enhanced, thereby improving the solder separation and stably supplying a fixed quantity of solder Pb supplied through the squeeze unit 40 to the printed circuit board S.

Further, the contact between the substrate jig 10 and the jig block 20 is stabilized, thereby preventing the suction unit 70 from damage. Further, the close contact between the printed circuit board S and the mask unit 30 is enhanced by the suction force, thereby preventing the suction force given to the sucker 71 from leakage.

Further, the printed circuit board S can be in position previously set corresponding to the pattern holes of the mask unit 30, thereby preventing the substrate jig 10 from moving in the jig block 20. Further, the mask unit 30 can be stably held with regard to the substrate jig 10 and the printed circuit board.

As described above, in the screen printer improved in solder separation and the method of controlling the same, the close contact between the printed circuit board and the mask unit is enhanced, thereby improving the solder separation and stably supplying a fixed quantity of solder supplied through the squeeze unit to the printed circuit board.

Further, the suction unit is prevented from damage while stabilizing the contact between the substrate jig and the jig block.

Further, the close contact between the printed circuit board and the mask unit is enhanced by the suction force, and the suction force given to the sucker is prevented from leakage.

Further, the printed circuit board can be in position previously set corresponding to the pattern holes of the mask unit, and the substrate jig is prevented from moving in the jig block.

Further, the mask unit can be stably held with regard to the substrate jig and the printed circuit board.

Although a few exemplary embodiments of the present disclosure have been shown and described, it will be appreciated by those skilled in the art that changes may be made in these embodiments without departing from the principles and spirit of the disclosure, the scope of which is defined in the appended claims and their equivalents.

What is claimed is:

1. A screen printer comprising:
   a substrate jig which supports a printed circuit board, and comprises a through hole formed in between a plurality of printed circuit boards supported being spaced apart from each other;
   a jig block on which the substrate jig is put on;
   a mask unit which comprises pattern holes formed to supply solder corresponding to preset positions of the printed circuit board;
   a jig conveying unit which conveys the substrate jig toward a top of the jig block;
   an ascending/descending driving unit which moves the jig block up and down or moves both the jig block and the jig conveying unit up and down; and
   a suction unit which comprises a sucker protruding from the jig block to be inserted in the through hole and making the mask unit be in close contact with the printed circuit board or the substrate jig by a suction force when the printed circuit board is in contact with the mask unit by the ascending/descending driving unit, and a suction driver driving the sucker to have the suction force so that the mask unit can be in close contact with the printed circuit board or the substrate jig.

2. The screen printer according to claim 1, wherein a top surface of the jig conveying unit is formed to have substantially a same level as a top surface of the printed circuit board or a top surface of the substrate jig when the printed circuit board is in contact with the mask unit by the ascending/descending driving unit.

3. The screen printer according to claim 1, further comprising an aligning unit which moves the jig conveying unit relative to the substrate jig so that the substrate jig can be in position in the jig block.

4. The screen printer according to claim 1, wherein the jig conveying unit comprises
   a suction holder configured to face the mask unit; and
   a holding driver configured to drive the suction holder to have a suction force when the mask unit is seated on the jig conveying unit by ascent/descent of the ascending/descending driving unit.

5. A method of controlling the screen printer according to according to claim 1, the method comprising:
   a jig conveying operation to move the substrate jig toward a top of the jig block;
   a first ascending/descending operation to move the jig block up so that the substrate jig can be put on the jig block;
   a second ascending/descending operation to move the substrate jig put on the jig block to a bottom of the mask unit; and
   a sucking operation to make the mask unit be in close contact with the printed circuit board or the substrate jig by a suction force of the sucker inserted in the through hole when the printed circuit board is in contact with the mask unit via the second ascending/descending operation.

6. The method according to claim 5, further comprising an aligning operation to move the jig conveying unit relative to the substrate jig so that the substrate jig can be in position in the jig block.

7. The method according to claim 5, further comprising a mask holding operation to make the mask unit be in close contact with the jig conveying unit by a suction force when the mask unit is in contact with the jig conveying unit via the second ascending/descending operation.

* * * * *